United States Patent [19]

Stokes

[11] Patent Number: 5,552,603
[45] Date of Patent: Sep. 3, 1996

[54] BIAS AND READOUT FOR MULTICOLOR QUANTUM WELL DETECTORS

[75] Inventor: Burnham Stokes, Altamonte Springs, Fla.

[73] Assignee: Martin Marietta Corporation, Baltimore, Md.

[21] Appl. No.: 306,575

[22] Filed: Sep. 15, 1994

[51] Int. Cl.$^6$ .............................. H01L 31/09; H01L 29/15
[52] U.S. Cl. .................. 250/338.4; 250/339.02; 250/370.12; 257/21; 257/440
[58] Field of Search ............... 257/21, 440; 250/370.12, 250/339.02, 338.4

[56] References Cited

U.S. PATENT DOCUMENTS

| | | | |
|---|---|---|---|
| 4,868,612 | 9/1989 | Oshima et al. | 257/14 |
| 4,998,154 | 3/1991 | Surridge et al. | 257/21 |
| 5,047,822 | 9/1991 | Little, Jr. et al. | 359/321 |
| 5,075,749 | 12/1991 | Chi et al. | 257/21 |
| 5,121,182 | 6/1992 | Kuroda et al. | 257/432 |
| 5,122,844 | 6/1992 | Akiba et al. | 257/13 |
| 5,144,397 | 9/1992 | Tokuda et al. | 257/656 |
| 5,373,182 | 12/1994 | Norton | 257/440 |

FOREIGN PATENT DOCUMENTS

| | | | |
|---|---|---|---|
| 0508970 | 10/1992 | European Pat. Off. | 257/21 |
| 4-124883 | 4/1992 | Japan | 257/440 |
| 5-21839 | 1/1993 | Japan | 257/21 |
| 2228824 | 9/1990 | United Kingdom | 257/440 |

OTHER PUBLICATIONS

C. Weisbuch et al., *Quantum Semiconductor Structures*, pp. 11–100, Academic press, Inc., San Diego, Calif. (1991).

L. West et al., "First Observation of an Extremely Large-–Dipole Infrared Transition with the Conduction Band of GaAs Quantum Well," *Appl. Phys. Lett.*, vol. 46, No. 12, pp. 1156–1158 (Jun. 15, 1985).

*Primary Examiner*—Constantine Hannaher
*Attorney, Agent, or Firm*—Burns, Doane, Swecker & Mathis, L.L.P.

[57] ABSTRACT

A three-color optical detector has independent bias and readout for the colors. The three-color detector includes a substrate and first, second, and third detector layers stacked one on top of another and the substrate. Each detector layer is designed to operate at a respective predetermined bias and to absorb incident light having wavelengths in a respective range. A plurality of conductive layers are interleaved among the three detector layers and the substrate in such a way that the respective biasses can be applied to the detector layers and signals generated by the detector layers can be accessed. A two-dimensional array of such three-color optical detectors is also described that is connected to an electronic device, such as a multiplexer, for applying the predetermined biasses and reading out the signals. The electronic device is disposed on a separate substrate and is electrically connected to the detectors on a pixel-by-pixel basis by a set of metallic bump bonds. The separate substrate includes a conducting metallization pattern for electrically connecting to predetermined ones of the conductive layers of the three-color detectors.

6 Claims, 5 Drawing Sheets

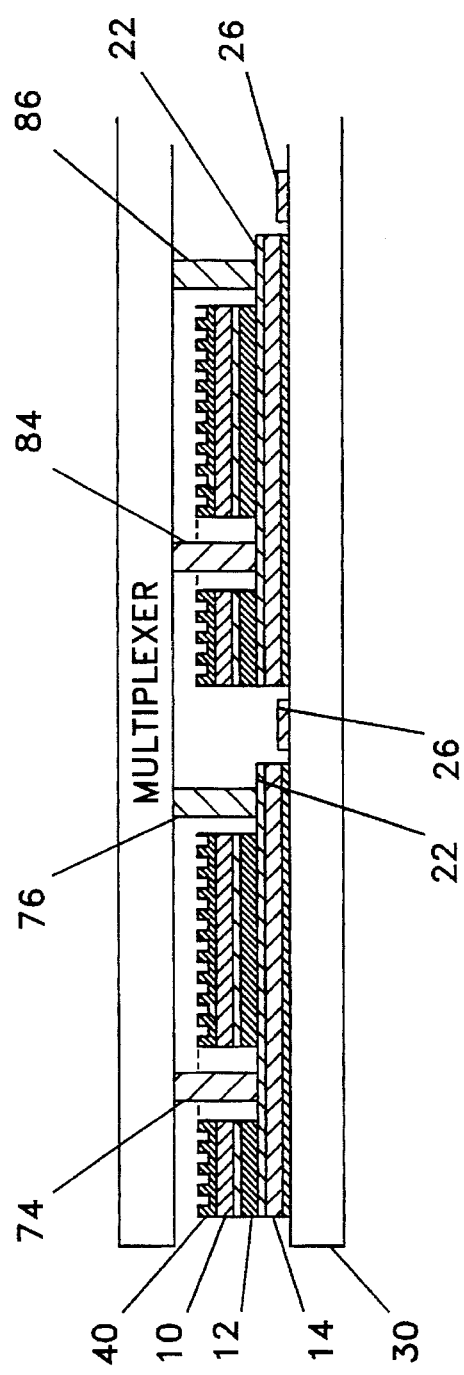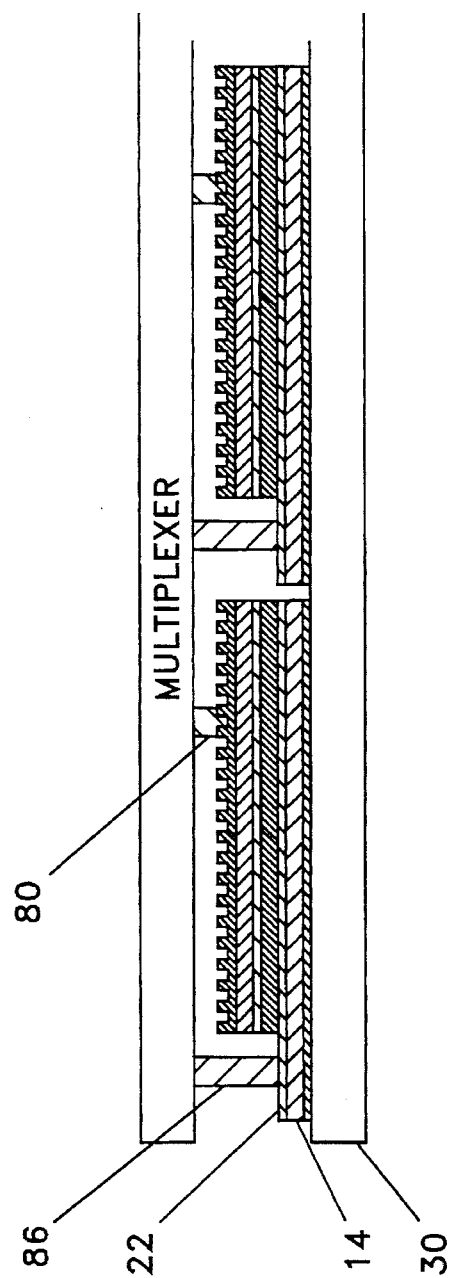

5,552,603

BIAS AND READOUT FOR MULTICOLOR QUANTUM WELL DETECTORS

BACKGROUND

Applicant's invention relates to semiconductor optical detector arrays and more particularly to means for biassing and reading out multicolor quantum-well (QW) detectors and detector arrays.

Most semiconductor optical detectors usefully respond to particular bands of wavelengths, or colors, that are usually determined by the detector material's composition. For example, alloys of mercury, cadmium, and tellurium are often used for detectors for the middle infrared (MIR) band and for the long infrared (LIR) band. The MIR band may be said to include wavelengths in the range from about 2000 nm to 6000 nm. The LIR band is often said to include wavelengths in the range from about 8000 nm to 12000 mm.

A multicolor optical detector is responsive to light of more than one wavelength band. Such detectors are usually formed by stacking detector sections that are responsive to particular wavelength bands and transparent to others. Light including the several wavelength bands that is incident on the stack is absorbed in one wavelength band by the first detector section, which transmits the remaining wavelength bands to the next detector section, which is responsive to one of the remaining bands.

Much work has been done recently on a wide range of electro-optic devices based on the electric-field dependence of strong absorption resonances in semiconductor quantum wells (QWs). These devices operate in a fashion that is much different from the operation of conventional semiconductor detectors like HgCdTe.

In a QW, a thin layer of one semiconductor material is sandwiched between cladding layers of a different material, with the electronic properties of the materials being such that an electric potential well (in the central layer) is formed between two electric potential barriers (in the cladding layers). The QW's small thickness, on the order of 100 Å, results in quantization of charge-carder motion in the thickness direction.

Also, QWs exhibit the quantum-confined Stark effect and Wannier-Stark localization, in which the wavelengths of the QW's peak optical absorptions associated with the creation of light- and heavy-hole excitons shift, respectively, to longer and shorter wavelengths in response to an applied electric field. Since these peak excitonic absorptions have finite spectral widths due to electron/hole interactions with material impurities and phonons, the transmissivity of a QW at a wavelength near a peak varies as the applied field varies. These and other aspects of QW devices are described in commonly assigned U.S. Pat. No. 5,047,822 to Little, Jr., et al.; U.S. patent application Ser. No. 08/109,550 filed Aug. 20, 1993, by Terranee L. Worchesky and Kenneth J. Ritter for "Hybridized Asymmetric Fabry-Perot Quantum Well Light Modulator" which is now U.S. Pat. No. 5,488,504; and U.S. patent application Ser. No. 08/193,979 filed Feb. 9, 1994, by John S. Ahearn and John W. Little, Jr., for "Infrared Image Converter". These three documents are expressly incorporated here by reference.

Because a single QW is so thin, devices are typically made by stacking a number of QWs, e.g., fifty, to obtain significant optical effects. Many aspects of multiple quantum well (MQW) devices are described in the literature, including C. Weisbuch et al., *Quantum Semiconductor Structures*, Academic Press, Inc., San Diego, Calif. (1991). The several QWs are separated by layers, such as superlattices, that form potential barriers.

In general, a superlattice is a stack of interleaved thin barrier layers and Qws in which the QWs are resonantly coupled, causing the QWs' discrete charge-carrier energy levels to broaden into minibands. Applying an electric field destroys the resonance, misaligning the energy levels in neighboring QWs and localizing them over a few QWs. This changes the optical absorption spectrum from a smooth, miniband profile to a peaked, QW-excitonic profile and blue-shifts the absorption edge.

One application of QWs is the quantum well infrared photodetector (QWIP). In the QWIP described in commonly assigned U.S. patent application Ser. No. 07/906,417 filed Jun. 30, 1992, by John W. Little, Jr., for "Miniband Transport Quantum Well Detector", which is expressly incorporated here by reference, internal photoemission of electrons from bound states in GaAs QWs into high-mobility channels in the QWIP's cladding layers increases the conductivity of the QWIP in the presence of thermal light, i.e., LIR wavelengths. The light is detected as an increase in the current flowing through the QWIP when operated at a fixed bias voltage. The characteristics of the QWIP (e.g., the peak-response wavelength, the optical bandwidth, and the electrical properties) are determined by the widths of the Qws (usually in the 4- to 8-nm width range) and the composition of the cladding layers (nominally thick layers of $Al_{(x)}Ga_{(1-x)}As$, with x ranging from 0.2 to 0.3).

That application also describes a multicolor detector in which the compositions and layer thicknesses of one QW section are selected such that the section's peak-response wavelength falls in a first wavelength band and the composition and layer thicknesses of the other QW section are selected such that the peak-response wavelength falls in a second wavelength band.

Such multicolor detectors have many uses as optical sensors and imagers, and the range of uses for such detectors is increased by fabricating them in two-dimensional arrays. As an array becomes larger, however, the complexity of the electronics needed for reading out the signals generated by the detector elements also increases. Moreover, applying the proper biasses to the individual sections of each multicolor detector element and reading the outputs of the sections are problems that have not been adequately addressed. Three-color QW detectors have been proposed but how to implement a multicolor IR QW detector array with simultaneous detection and separate readout has not.

U.S. Pat. No. 5,144,397 to Tokuda et al. discloses three or more light-responsive device components by which more than two different wavelengths can be detected. The wavelengths are selected by applying various resistances and/or voltages, but the patent does not disclose how the biasses would be applied with respect to a readout multiplexer.

U.S. Pat. No. 5,121,182 to Kuroda et al. discloses a device comprising a plurality of individually biassed photodiodes, and the biasses are selected to adjust the wavelength detected. The design of the device is such that a customized readout multiplexer would be necessary, with concomitant greatly increased cost and complexity.

U.S. Pat. No. 4,868,612 to Oshima et al. discloses a multiple quantum well device having three wells in which the layer sequence is repeated a selected number of times. Carriers in the device move by tunneling, not by using a conduction band, and the patent does not disclose how the biasses are applied. Also, the device would not provide independent simultaneous outputs for multicolor inputs.

SUMMARY

Applicant's invention overcomes several problems that arise in providing bias and readout of a multicolor QW detector array. Using the invention, optical registration between detector sections is maintained and costly, time-consuming custom readout multiplexer development is avoided.

In one aspect of the invention, a three-color optical detector includes a substrate and first, second, and third detector layers stacked one on top of another and the substrate. Each detector layer is designed to operate at a respective predetermined bias and to absorb incident light having wavelengths in a respective range. A plurality of conductive layers are interleaved among the three detector layers and the substrate in such a way that the respective biasses can be applied to the detector layers and signals generated by the detector layers can be accessed.

In another aspect of the invention, a two-dimensional array of such three-color optical detectors is connected to an electronic device, such as a multiplexer, for applying the predetermined biasses and reading out the signals. The electronic device is disposed on a separate substrate and is electrically connected to the detectors on a pixel-by-pixel basis by a set of metallic bump bonds. The separate substrate includes a conducting metallization pattern for electrically connecting to predetermined ones of the conductive layers of the three-color detectors.

BRIEF DESCRIPTION OF THE DRAWINGS

The objects, features, and advantages of Applicant's invention will be apparent from reading the following detailed description in conjunction with the drawings, in which:

FIGS. 3A–3C show cross-sections of the array shown in FIG. 3; and

DETAILED DESCRIPTION

Figure 1:
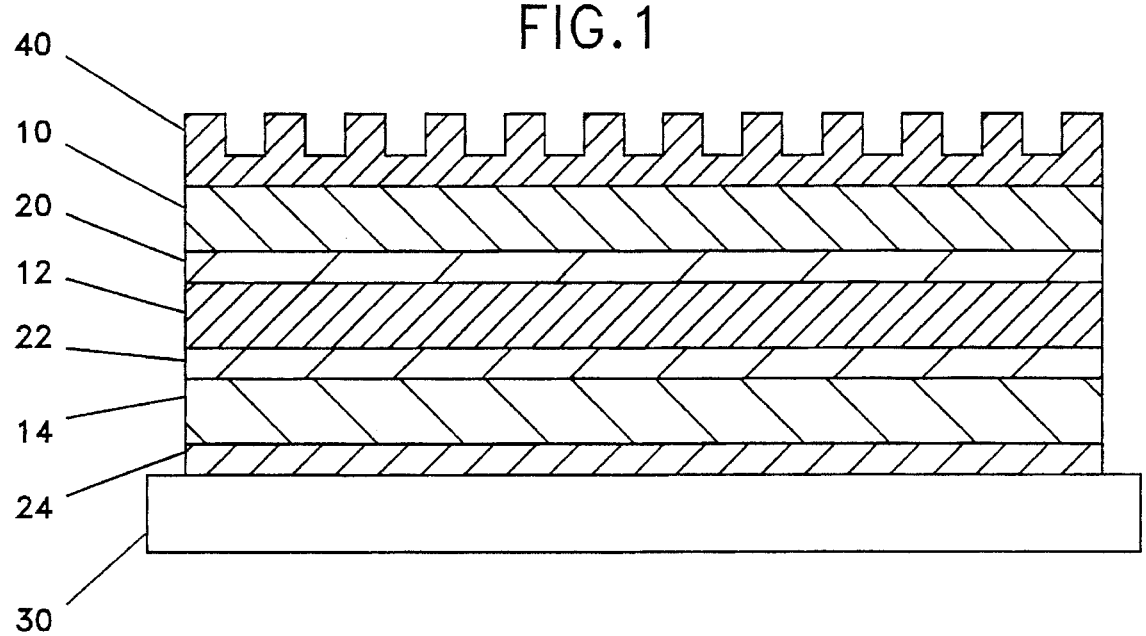
FIG. 1 illustrates a three-color quantum well detector.

In general, a three-color QW detector can be produced by growing three different layers of superlattice structures, one on top of another, as illustrated in FIG. 1. The figure shows three different QW layers 10, 12, 14 prior to individual detector delineation and interleaved with three conducting (n+) layers 20, 22, 24. Each QW layer is preferably designed to operate at substantially the same bias voltage, which may range between 1.0 and 5.0 volts. The design bias voltage of each layer is determined by the design wavelength, doping levels, and the number of individual quantum well detectors in that layer as described in the above-incorporated U.S. patents and patent applications. To use such a three-color detector, it is highly desirable to bias each QW layer and read-out signals from each layer independently.

Also illustrated in FIG. 1 is a substrate 30, such as GaAs, and an optical diffraction grating 40 that may be etched into the upper QW layer and that may have a metal contact deposited on its upper surface. It will be appreciated that light incident through the substrate 30 is not detected as it passes through the multilayer structure 10–14, 20–24. The grating, which has dimensions and an efficiency appropriate for the wavelengths to be detected, produces a diffracted component of the incident light that is polarized perpendicular to the detectors' layers and it is that diffracted component that is detected. It will be understood that such a polarization is required by the selection rules governing the absorption of infrared light in quantum wells, as described in, e.g., L. West et at., "First Observation of an Extremely Large-Dipole Infrared Transition within the Conduction Band of a GaAs Quantum Well", *Appl. Phys. Lett.* vol. 46, pp. 1156–1158 (Jun. 15, 1985).

Instead of or in addition to a grating 40, any of the various known techniques for increasing the proportion of the incident light that may be detected may be used with Applicant's device. For example, grating lines may be etched into the surface of the substrate 30 if the imaging properties of the array are not important. Photons diffracted through the detectors may then be reflected by a metallic capping layer, and the reflected photons would have another chance at absorption.

Figure 2A:
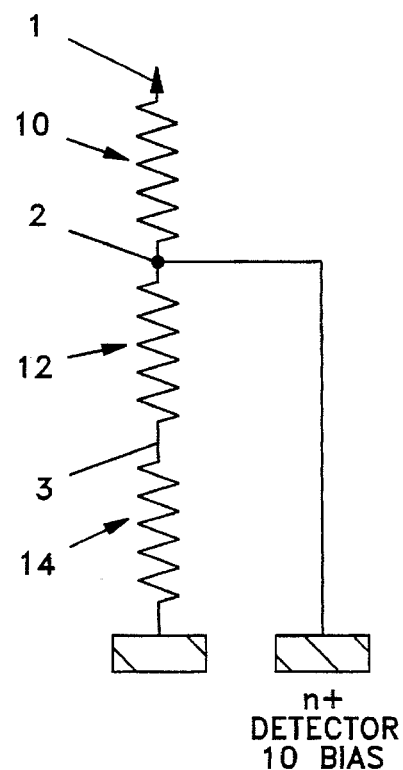
FIGS. 2A–2D illustrate electrical equivalent circuits of the three-color detector.
Figure 2B:
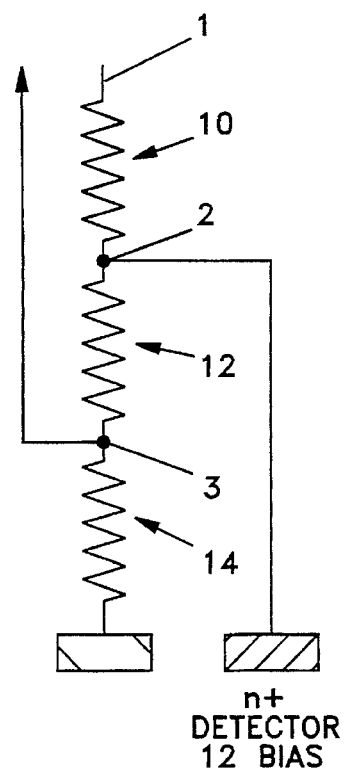
Figure 2C:
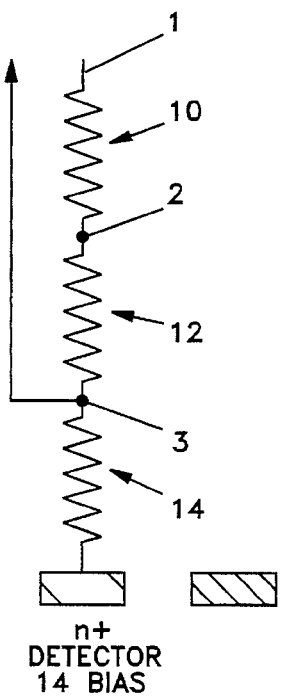
Figure 2D:
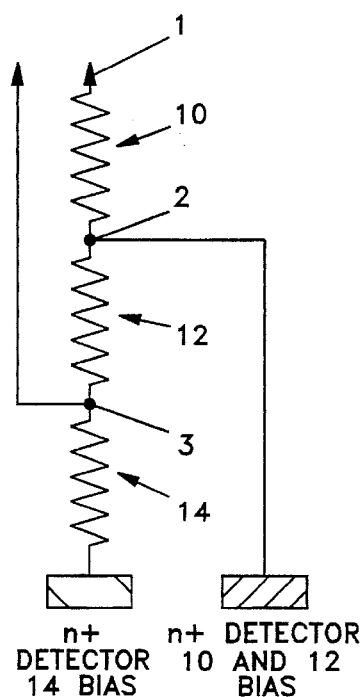

FIGS. 2A–2D illustrate simplified electrical equivalent circuits of a three-color QW detector such as that illustrated in FIG. 1. In essence, each layer 10, 12, 14, or color, acts as a resistor, and the equivalent resistors appear to be electrically connected in series. The points designated 1, 2, 3 in the figures indicate where the bias and readout connections are made for the three colors. FIG. 2A illustrates the electrical circuit for biasing and reading the layer 10; FIG. 2B illustrates the electrical circuit for biasing and reading the layer 12; and FIG. 2C illustrates the electrical circuit for biasing and reading the layer 14. FIG. 2D shows the complete equivalent circuit.

It will be noted that two separate biasses may be applied to the three-color detector, and a means for connecting one of these biasses to point 2, the point between the layers 10 and 12, is required. In addition, only two connections to the readout electronics are required, and these are represented by the arrows at the top of FIG. 2D. These connections may be made by metallic bump bonds or solder bonds. Applicant's invention can be used with substantially any multiplexer designed for a photovoltaic detector array, and such multiplexers are commercially available from several sources, including Cincinnati Electronics, Santa Barbara Focal Plane, Santa Barbara Research Center, and Westinghouse.

In accordance with the invention, independently reading out and applying a bias to each layer, or color, with connections as indicated in FIGS. 2A–2D, is carried out as follows.

1. The bias to the layer 10 is applied to the junction between layers 10 and 12 (point 2 in FIG. 2A, which corresponds to the conducting layer 20 in FIG. 1). The connection to the readout electronics indicated by the arrow in FIG. 2A completes the electrical circuit for layer 10. Signal charge carriers generated by the layer 10 are accumulated in the readout electronics for one frame time in the usual way. As noted above, the frame time and other features of the multiplexer do not substantially affect the implementation of Applicant's bias and readout.

2. The bias to the layer 12 is also applied to the junction between layers 10 and 12 (point 2 in FIG. 2B). The connection to the other portion of the readout electronics indicated by the arrow in FIG. 2B is made from point 3 between the layers 12 and 14. Point 3 corresponds to the conducting layer 22 in FIG. 1. This connection completes the electrical circuit for layer 12. Signal charge carriers generated by the layer 12 are accumulated in the readout electronics for one frame time in the usual way.

3. The bias to the layer 14 is applied to a junction at the bottom of layer 14 (see FIG. 2C), which corresponds to the conducting layer 24 in FIG. 1. The connection to the portion of the readout electronics used by layer 12 indicated by the arrow in FIG. 2C is also made from point 3. This connection completes the electrical circuit for layer 14. Signal charge carriers generated by the layer 14 are accumulated in the readout electronics for one frame time in the usual way.

4. Signal charge carriers from both layers 10, 12 may be read simultaneously since their biasses are provided through point 2 (conducting layer 20). Of course, the three-color detector must be designed so that a common bias is appropriate for the layers 10, 12. If different biasses are necessary, it would be possible to apply first one bias and then the other repetitively. Signal charge carders from the two layers would then be collected during alternating frame times, and a means for synchronizing the alternating bias and multiplexer could have a simple, straightforward design.

5. Signal charge carders from all three layers 10, 12, 14 may be collected simultaneously during one frame time by simultaneously applying the biasses to conducting layers 20, 24. Signal charge carders from the layers 12, 14 are collected in one portion of the readout electronics, and signal charge carders from the layer 10 are collected in the other portion of the readout electronics. It will be appreciated that the "portions" of the readout electronics typically correspond to unit cells of a conventional multiplexer and that the signals from the two colors fed to the same readout cells are not separated but are combined in this mode of operation.

Figure 3:
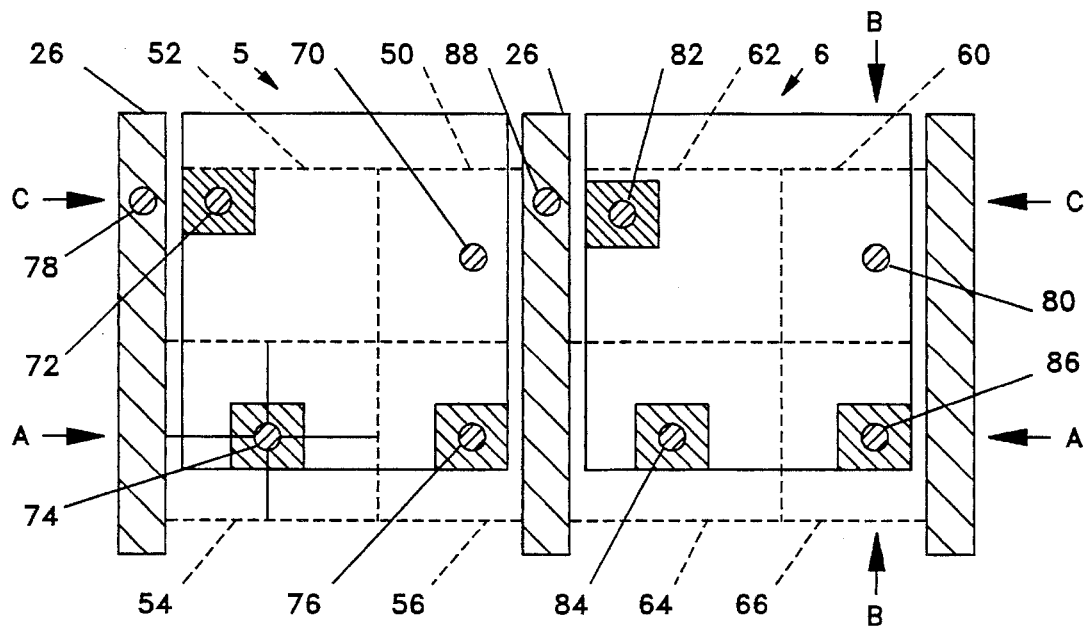
FIG. 3 shows a top view of two pixels of a three-color quantum well detector array.

FIG. 3 illustrates how a slightly modified conventional single-color-detector multiplexer can be used with a three-color detector. The figure shows a top view two three-color detectors, or pixels, 5, 6, which have linear dimensions that are about twice the linear dimensions of the unit cells of the multiplexer (eight unit cells 50–56, 60–66 are indicated by the dashed lines). Basically, each three-color detector covers four unit cells of the multiplexer. The two outputs from each pixel, one for one color and one for the other two colors, may be connected by metallic bump bonds 70, 72, and 80, 82, respectively, to the multiplexer unit cells. The bump bonds 70–76, 80–86 are depicted in FIG. 3 as the dark circles.

Figure 3C:
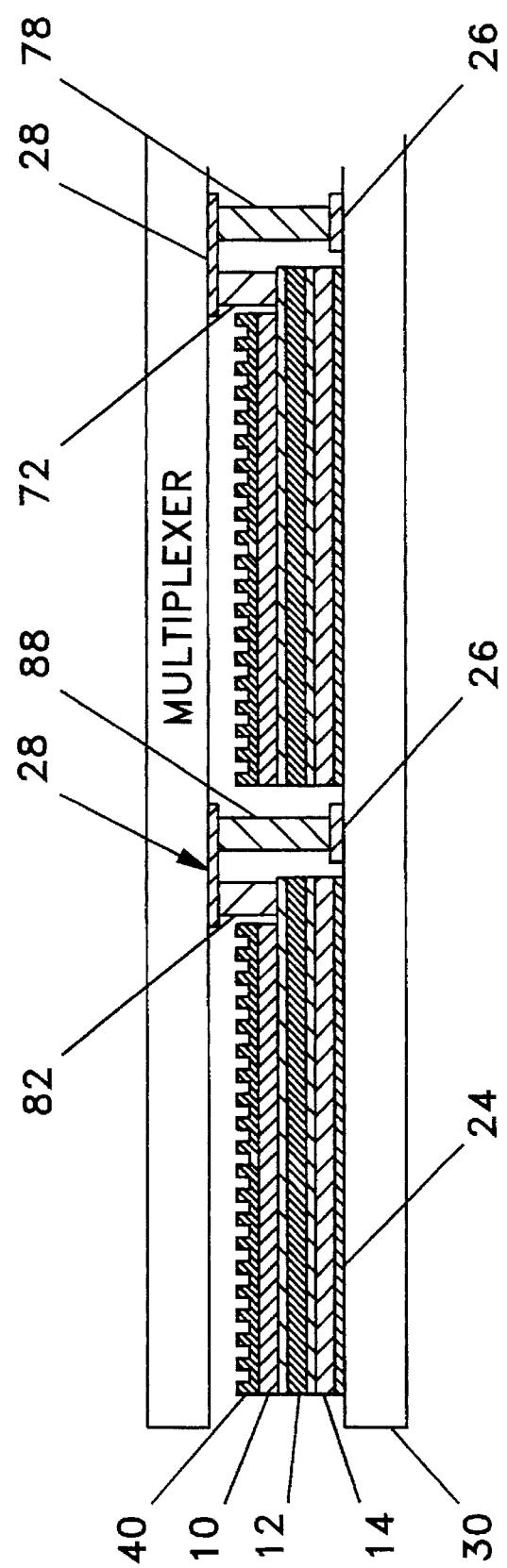

FIGS. 3A–3C illustrate the metallic bump connections 70–76, 80–86 and the delineation etches required by the two three-color detectors. Basically, for each group of four multiplexer unit cells, only four bump connections are required, and one of the four unit cells (cells 54, 64) is unused.

FIG. 3A shows a cross-section through FIG. 3 along the line A—A; the bumps 74, 76, 84, 86 provide electrical connections to the multiplexer unit cells 54, 56, 64, 66. FIG. 3B shows a cross-section through FIG. 3 along the line B—B and the bump connections 70, 76, 80, 86 to the unit cells 50, 56, 60, 66.

FIG. 3C shows a cross-section through FIG. 3 along the line C—C and illustrates the minor multiplexer modification that allows the additional bias connection to be made. Bump connections 72, 82, shown in this cross section, simply make electrical connections between a conducting (n+) layer 26 and the conducting layer 20. The layer 26, which is also illustrated in FIG. 3, may be etched out of the layer 24 when the small gaps, e.g., a few micrometers (μm) wide, are formed that define the pixels. Also, metallic bumps 78, 88 are provided to connect the conductive layers 26 to conductive metallizations 28 provided on the multiplexer. As seen in FIG. 3C, the metallizations 28 complete the connection between the layers 20, 26.

In general, the need to provide the metallizations 28 does not impose any restrictions on the type of multiplexer that can be used. These metallizations can be applied as an additional metal rib by the last (and final) multiplexer mask.

Figure 4:
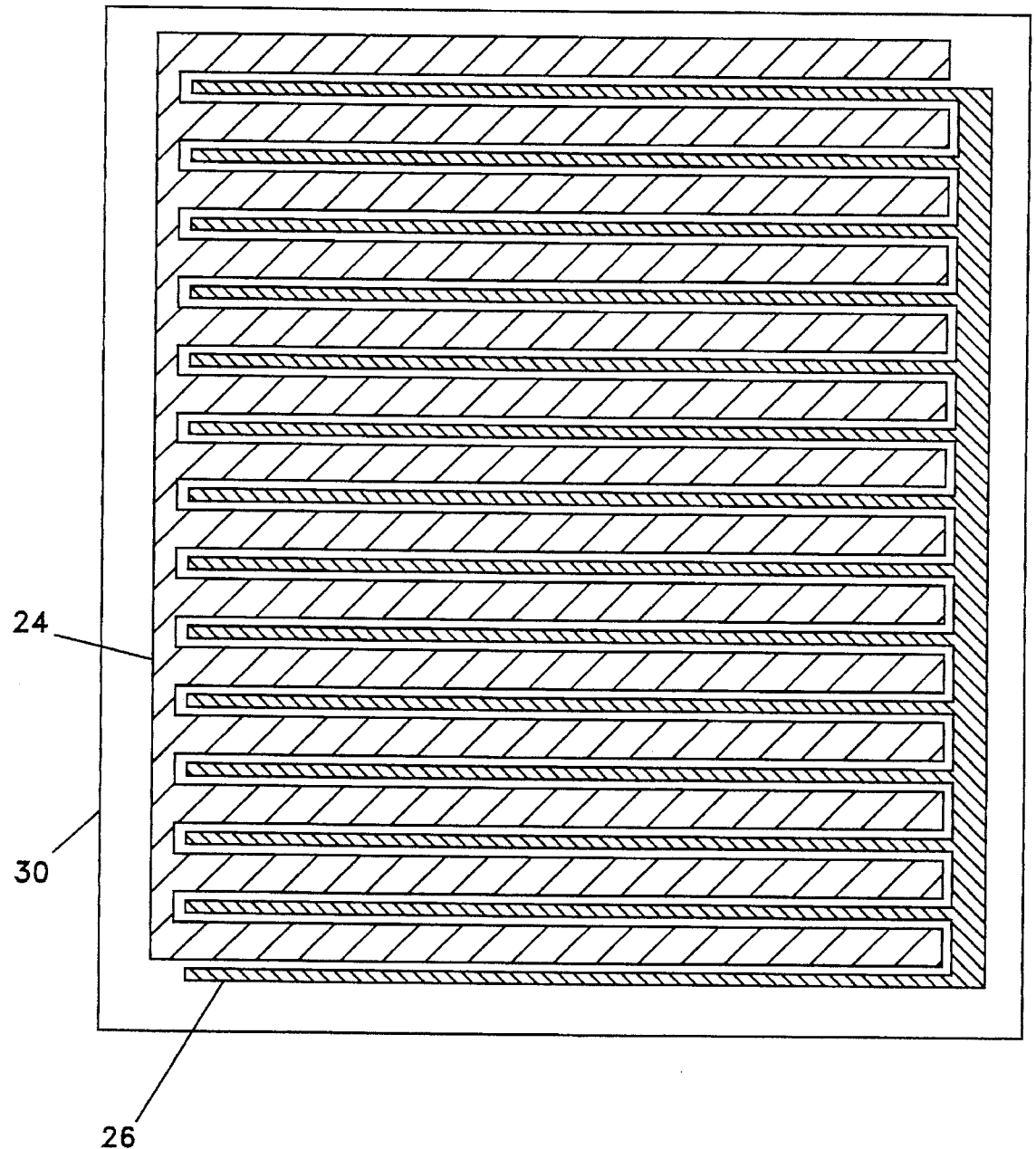
FIG. 4 illustrates two interleaved conductive layers in a three-color detector.

FIG. 4 illustrates the interleaved arrangement of the conductive layers 24, 26 on the substrate 30 for one pixel. This interleaving, and the electrical connection of the layer 20 to the layer 26, are essential features of Applicant's invention. In forming the interleaved layers, it is only necessary that they conform to the geometry of the multiplexer selected.

Applicant's invention has been described above in terms of specific embodiments. It will be readily appreciated by one of ordinary skill in the art, however, that the invention is not limited to those embodiments, and that, in fact, the principles of the invention may be embodied and practiced in other devices and methods. Therefore, the invention should not be regarded as delimited by those specific embodiments but by the following claims.

What is claimed is:

1. A three-color optical detector having independent bias and readout for the colors comprising:

a substrate;

first, second, and third detector layers stacked one on top of another and on the substrate, wherein each detector layer is designed to operate at a respective predetermined bias and comprises a stack of a plurality of thin layers for absorbing incident light, and the first detector layer absorbs incident light having wavelengths in a first range, the second detector layer absorbs incident light having wavelengths in a second range, and the third detector layer absorbs incident light having wavelengths in a third range;

a plurality of conductive layers interleaved among the three detector layers and the substrate, whereby the respective biasses can be simultaneously applied to the detector layers and signals generated by the detector layers can be simultaneously accessed; and means for producing a component of light incident on the three-color detector that is polarized perpendicular to the detector layers.

2. The three-color optical detector of claim 1, wherein signals generated by two of the detector layers are accessible through one of the conductive layers, and signals generated by the remaining detector layer are accessible through another conductive layer.

3. The three-color optical detector of claim 1, wherein the first, second, and third detector layers each comprise a plurality of quantum wells.

4. A three-color optical detector array having independent bias and readout for the colors and array elements comprising:

a substrate;

a plurality of three-color optical detectors arranged in a pixel format disposed on the substrate, each three-color optical detector comprising:

first, second, and third detector layers stacked one on top of another and on the substrate, wherein each detector layer is designed to operate at a respective predetermined bias and comprises a plurality of thin layers for absorbing incident light, and the first detector layer absorbs incident light having wavelengths in a first range, the second detector layer absorbs incident light having wavelengths in a second range, and the third detector layer absorbs incident light having wavelengths in a third range;

a plurality of conductive layers interleaved among the three detector layers and the substrate, whereby the respective biasses can be simultaneously applied to the detector layers and signals generated by the detector layers can be simultaneously accessed; and means for producing a component of light incident on the three-color detector that is polarized perpendicular to the detector layers; and a plurality of electronic means for applying the predetermined biasses to the three-color optical detectors, wherein the electronic means are disposed on a separate substrate and are electrically connected to the detectors on a pixel-by-pixel basis by a set of metallic bump bonds, and wherein the separate substrate includes a conducting metallization pattern for electrically connecting to predetermined ones of the conductive layers of the three-color detectors.

5. The three-color optical detector of claim 4, wherein signals generated by two of the detector layers are accessible through one of the conductive layers, and signals generated by the remaining detector layer are accessible through another conductive layer.

6. The three-color optical detector of claim 4, wherein the first, second, and third detector layers each comprise a plurality of quantum wells.

\* \* \* \* \*